(12) United States Patent
Bartlett et al.

(10) Patent No.: US 6,638,784 B2
(45) Date of Patent: Oct. 28, 2003

(54) HERMETIC CHIP SCALE PACKAGING MEANS AND METHOD INCLUDING SELF TEST

(75) Inventors: James L. Bartlett, Cedar Rapids, IA (US); James R. Wooldridge, Cedar Rapids, IA (US); Christopher G. Olson, Mt. Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/339,127

(22) Filed: Jun. 24, 1999

(65) Prior Publication Data

US 2003/0073292 A1 Apr. 17, 2003

(51) Int. Cl.[7] .............................................. H01L 21/00
(52) U.S. Cl. ............................... 438/51; 438/52; 438/53
(58) Field of Search ................................. 257/731, 707, 257/710, 704, 732, 711; 438/48, 50, 51, 458, 52, 53

(56) References Cited

U.S. PATENT DOCUMENTS

| | | | | |
|---|---|---|---|---|
| 4,430,895 A | | 2/1984 | Colton ......................... 73/497 |
| 5,668,033 A | * | 9/1997 | Ohara et al. .................. 438/50 |
| 5,837,562 A | * | 11/1998 | Cho ............................. 438/51 |
| 5,837,935 A | * | 11/1998 | Carper et al. .............. 174/52.4 |
| 6,062,461 A | * | 5/2000 | Sparks et al. ............. 228/123.1 |
| 6,100,108 A | * | 8/2000 | Mizuno et al. ................ 438/51 |
| 6,180,435 B1 | * | 1/2001 | Ise et al. ..................... 438/458 |
| 6,235,612 B1 | * | 5/2001 | Wang et al. ................. 438/458 |

OTHER PUBLICATIONS

Dirk De Bruyker, "A Combiner Piezoresistive/ . . . Pressure Senson with Self Test . . . ", 1997 IEEE, 1461–1464.*
Liwel Lin, "MEMS Pressure Sensors . . . ", 1998 IEEE, 429–436.*
Cheng gui Hou, "A Pressure Sensor Made of Two Pieszoresistive Bridges", 1996 IEEE.*

* cited by examiner

Primary Examiner—Kevin M. Picardat
(74) Attorney, Agent, or Firm—Nathan O. Jensen; Kyle Eppele

(57) ABSTRACT

An integrated circuit chip and method of manufacturing the same which includes the use of a wafer cap having depressions therein for aligning with micro-electro-mechanical systems included in said integrated circuit when said cap is placed over a wafer containing numerous integrated circuits, the wafer is then cut, after the wafer cap is bound to the wafer. The wafer cap may also include a piezo-resistive element thereon for measuring pressure around the hermetically sealed MEMS.

10 Claims, 1 Drawing Sheet

HERMETIC CHIP SCALE PACKAGING MEANS AND METHOD INCLUDING SELF TEST

BACKGROUND OF THE INVENTION

The present invention relates to integrated circuit (IC) chips, and more particularly relates to such chips having micro-electro-mechanical-systems (MEMS) included thereon, and even more particularly relates to hermetic packaging of such MEMS.

In the past, MEMS have been included on chips for numerous reasons, and MEMS have provided much functionality.

While use of the MEMS on chips has some beneficial aspects, it does have serious drawbacks. The MEMS become damaged during conventional wafer processing steps and as a result, they are typically bonded to a chip individually at the chip level. This chip level processing of MEMS is time consuming and relatively expensive.

Consequently, there exists a need for improved IC chips having MEMS thereon and for improved methods of manufacturing the same.

SUMMARY OF THE INVENTION

It is an object of the present invention to provide an improved hermetic MEMS chip package.

It is a feature of the present invention to include a hermetic cap bonded to a wafer containing numerous chips with MEMS thereon.

It is an advantage of the present invention to eliminate the need for capping of MEMS individually at the chip level.

It is another object of the present invention to provide for self-test capability of MEMS.

It is another feature of the present invention to include piezo-resistive pressure sensor for sensing pressure around the MEMS.

It is another advantage of the present invention to sense a pressure change as a result of a hermetic packaging failure.

The present invention is a hermetic MEMS chip package and method for processing the same, which is designed to satisfy the aforementioned needs, provide the previously stated objects, include the above-listed features and achieve the already articulated advantages.

Accordingly, the present invention is a hermetic MEMS chip package and method which includes providing a hermetic cap over a wafer containing numerous MEMS chips thereon.

BRIEF DESCRIPTION OF THE DRAWINGS

The invention may be more fully understood by reading the foregoing description of the preferred embodiments of the invention in conjunction with the appended drawings wherein.

DETAILED DESCRIPTION

Figure 1:
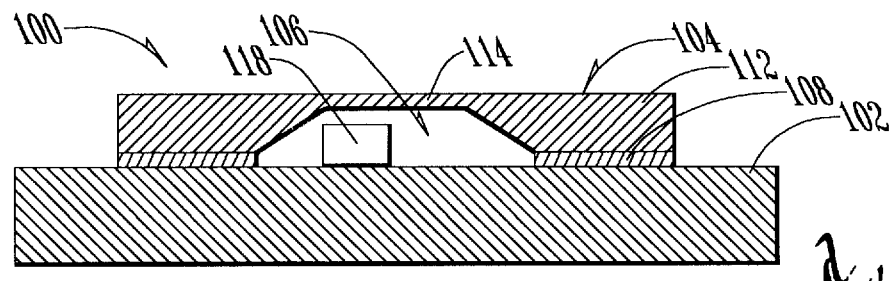
FIG. 1 is a simplified cross-sectional diagram of a hermetic MEMS chip level package of the present invention, which includes an enlarged MEMS cavity in which MEMS may be disposed.

Now referring to the drawings, wherein like numerals refer to like matter throughout, and more particularly to FIG. 1, there is shown a MEMS chip package 100, of the present invention, which includes a MEMS chip base die 102, which is any type of die which is well known in the art. Disposed on top of MEMS chip base die 102 is MEMS hermetic cap 104, which is a portion of a wafer cap which is milled or etched or otherwise made to have cavities therein for enclosing MEMS disposed on a wafer having many chips thereon. MEMS hermetic cap 104 is coupled to MEMS chip base die 102 by a glass bond or other known technique. Disposed between MEMS chip base die 102 and MEMS hermetic cap 104 is enlarged MEMS cavity 106 which is enlarged by cavities or depressions in MEMS hermetic cap 104 to facilitate coverage of MEMS. MEMS hermetic cap 104 has a thick region 112 and a thin region 114. The thin region 114 corresponds to a depression or cavity in MEMS hermetic cap 104 and is preferably disposed over a high profile MEMS 118.

Figure 2:
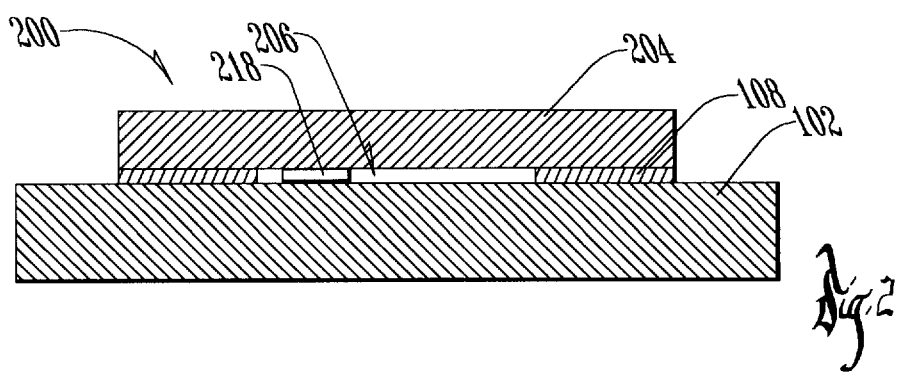
FIG. 2 is a simplified cross-sectional diagram of a hermetic MEMS chip level package of the present invention, which does not include an enlarged MEMS cavity in which MEMS may be disposed.

Now referring to FIG. 2, there is shown an alternate MEMS chip package 200, of the present invention which includes a MEMS chip base die 102 and a flat MEMS hermetic cap 204, which does not have any depressions or cavities therein. Flat MEMS hermetic cap 204 is coupled to MEMS chip base die 102 by bonding material 108. Flat MEMS cavity 206 does not have an enlarged area therein for covering larger MEMS. Low profile MEMS 218 is shown disposed in flat MEMS cavity 206.

Figure 3:
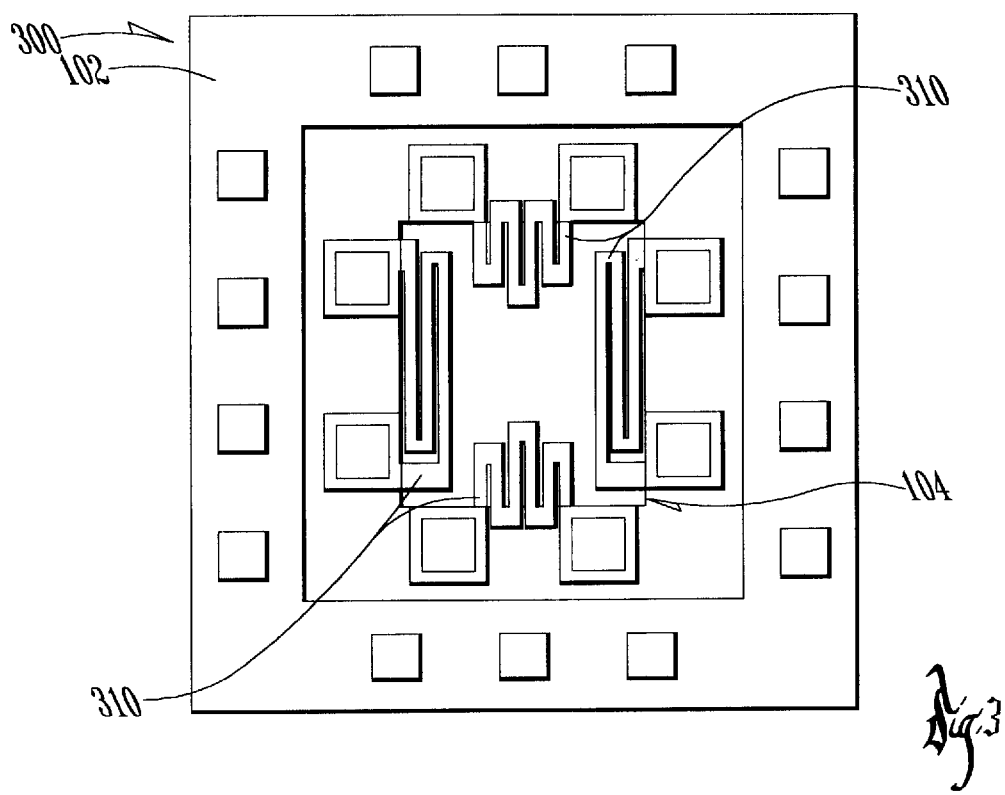
FIG. 3 is a top view of a MEMS chip, of the present invention, which shows piezo-resistive elements disposed thereon.

Now referring to FIG. 3, there is shown a Self test MEMS chip package 300, of the present invention, which includes a MEMS chip base die 102, a MEMS hermetic cap 104 and several piezo-resistive elements 310. Piezo-resistive elements 310 are shown disposed over the MEMS hermetic cap 104 and are capable of measuring deflections in MEMS hermetic cap 104 which are result of failures of the Self test MEMS chip package 300 to maintain a hermetic seal and bond. Piezo-resistive elements 310 are known in the art and have been used for various sensing needs, including use as an accelerometer, such as that described in U.S. Pat. No. 4,430,895, entitled Piezoresistive Accelerometer, by Russell F. Colton.

In operation, the method of the present invention includes the steps of providing a wafer having numerous integrated circuits thereon. The integrated circuits having MEMS devices incorporated therein. Providing a MEMS hermetic cap 104 with depressions therein for location over the MEMS devices. Bonding the MEMS hermetic cap 104 to the wafer using low temperature glass bonding or other known techniques. The bonding process will include creating an independent hermetic bond around the various MEMS devices. Sawing the wafer into numerous individual MEMS chip packages 100. The MEMS hermetic cap 104 may have disposed thereon piezo-resistive elements 310. Alternatively, piezo-resistive elements 310 may be added after MEMS hermetic cap 104 is bound to the wafer and before or after the wafer is cut into individual integrated circuits.

It is thought that the method and apparatus of the present invention will be understood from the foregoing description and that it will be apparent that various changes may be made in the form, construction, steps and arrangements of the parts and steps thereof, without departing from the spirit and scope of the invention or sacrificing all of their material advantages. The form herein described is merely a preferred or exemplary embodiment thereof.

We claim:

1. A method of manufacturing an integrated circuit chip package of the type having a MEMS, the method comprising the steps of:
   providing a wafer base;
   providing a plurality of integrated circuits on said wafer base;
   wherein said plurality of integrated circuits includes a plurality of MEMS;
   providing a wafer cap extending over a plurality of said integrated circuits;
   bonding said wafer cap a said wafer base;
   separating said integrated circuits into:
      a plurality of individual MEMS chip base dies;
      a plurality of MEMS disposed on said plurality of MEMS chip base dies;
      a plurality of MEMS hermetic caps disposed over said plurality of MEMS and bound to said plurality of MEMS chip base dies, wherein said plurality of MEMS chip base dies and plurality of MEMS hermetic caps are portions of said wafer and said wafer cap, respectively, which have been cut into individual packages after said wafer and said wafer cap are bound together; and
   providing a pressure sensing element disposed on an exterior surface of each of said plurality of MEMS hermetic caps, and said pressure sensing element configured for sensing deflection of said plurality of MEMS hermetic caps as a result of a failure of a hermetic seal between one of said plurality of MEMS chip base dies and one of said plurality of MEMS hermetic caps.

2. A method of claim 1 wherein said plurality of MEMS hermetic caps have depression therein which are aligned with said plurality of MEMS on said plurality of MEMS chip base dies after said plurality of MEMS hermetic caps are bonded to said plurality of MEMS chip base dies.

3. A method of claim 2 wherein said each of said plurality of MEMS has a height dimension, measured with respect to one of said plurality of MEMS chip base dies which is greater than a height dimension of a bonding material disposed between one of said plurality of MEMS chip base dies and one of said plurality of MEMS hermetic caps.

4. A method of claim 1 wherein said pressure sensing element is a piezo-resistive element.

5. A method of claim 3 wherein said bonding material is a glass bonding material.

6. A method of claim 2 wherein said depressions are micro-machined cavities.

7. A method of claim 6, wherein each of said plurality of MEMS hermetic caps has a thin section and a thick section, wherein said thin section is associated with said depression.

8. A method of claim 7 wherein said pressure sensing element is disposed on one of said plurality of MEMS hermetic caps at said thin section.

9. A method of manufacturing an integrated circuit chip, comprising the steps of:
   providing a wafer base;
   providing a plurality of integrated circuits on said wafer base;
   wherein said integrated circuits include a MEMS;
   providing a wafer cap extending over a plurality of said integrated circuits;
   bonding said wafer cap to said wafer base;
   separating said integrated circuits; and
   providing a piezo-resistive pressure element on an exterior surface of said wafer cap configured for measuring deflection of said wafer cap as a result of a pressure characteristic of a void between a portion of said wafer and a portion of said wafer cap.

10. A method of claim 9 wherein said bonding said wafer cap to said wafer base uses a glass bonding process.

* * * * *